(12) United States Patent
Kim et al.

(10) Patent No.: US 9,577,203 B2
(45) Date of Patent: Feb. 21, 2017

(54) ORGANIC LIGHT-EMITTING DIODE DISPLAY

(71) Applicant: Samsung Display Co., Ltd., Yongin, Gyeonggi-Do (KR)

(72) Inventors: Younjoon Kim, Yongin (KR); Yunmo Chung, Yongin (KR); Sangjo Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 1 day.

(21) Appl. No.: 14/659,231

(22) Filed: Mar. 16, 2015

(65) Prior Publication Data

US 2016/0111479 A1   Apr. 21, 2016

(30) Foreign Application Priority Data

Oct. 21, 2014 (KR) ........................ 10-2014-0142767

(51) Int. Cl.
| | |
|---|---|
| *H01L 23/48* | (2006.01) |
| *H01L 51/00* | (2006.01) |
| *H01L 27/32* | (2006.01) |

(52) U.S. Cl.
CPC ....... *H01L 51/0097* (2013.01); *H01L 27/3248* (2013.01); *H01L 27/3262* (2013.01)

(58) Field of Classification Search
CPC .................... H01L 51/0097; H01L 2251/5338; H01L 23/3262; H01L 23/3248
See application file for complete search history.

(56) References Cited

U.S. PATENT DOCUMENTS

| | | | |
|---|---|---|---|
| 2006/0132461 A1 | 6/2006 | Furukawa et al. | |
| 2007/0018170 A1 | 1/2007 | Jeong et al. | |
| 2013/0342429 A1* | 12/2013 | Choi | ............... H05K 13/00 345/30 |
| 2014/0138651 A1 | 5/2014 | Oh | |
| 2016/0079336 A1* | 3/2016 | Youn | ................ H01L 27/3276 257/40 |

FOREIGN PATENT DOCUMENTS

| | | |
|---|---|---|
| JP | 4589830 B2 | 9/2010 |
| KR | 10-2007-0010938 A | 1/2007 |
| KR | 10-2007-0117896 A | 12/2007 |
| KR | 10-2014-0042553 A | 4/2014 |
| KR | 10-2014-0064154 A | 5/2014 |

* cited by examiner

*Primary Examiner* — Nicholas Tobergte
(74) *Attorney, Agent, or Firm* — Knobbe Martens Olson & Bear LLP

(57) ABSTRACT

An organic light-emitting diode display is disclosed. In one aspect, the display includes a substrate including a bending area and a non-bending area and a plurality of thin-film transistors (TFTs) formed in the non-bending area. The display also includes a plurality of first pixel electrodes and a plurality of second pixel electrodes formed over the TFTs and electrically connected to the TFTs, the first pixel electrodes formed in the bending area and the second pixel electrodes formed in the non-bending area.

14 Claims, 5 Drawing Sheets

ORGANIC LIGHT-EMITTING DIODE DISPLAY

CROSS-REFERENCE TO RELATED APPLICATIONS

This application claims the benefit of Korean Patent Application No. 10-2014-0142767, filed on Oct. 21, 2014, in the Korean Intellectual Property Office, the disclosure of which is incorporated herein in its entirety by reference.

BACKGROUND

Field

The described technology generally relates to an organic light-emitting diode display.

Description of the Related Technology

In general, an organic light-emitting diode (OLED) display outputs various information such as display status or operating conditions, a user interface for easy usage, as well as an image or a video. Attempts are being made to further improve user experience by enabling an OLED display to be flexible.

SUMMARY OF CERTAIN INVENTIVE ASPECTS

One inventive aspect is an OLED display that prevents a display error from occurring in the bending area.

Another aspect is an OLED display that includes: a substrate that comprises a bending area; a plurality of thin-film transistors (TFTs) that are formed in an area of the substrate other than the bending area; and a plurality of first pixel electrodes and a plurality of second pixel electrodes that are formed on the plurality of TFTs and are electrically connected to the plurality of TFTs, wherein the plurality of first pixel electrodes are formed in the bending area of the substrate and the plurality of second pixel electrodes are formed in an area of the substrate other than the bending area.

A number of the plurality of TFTs can be equal to a number obtained by summing the plurality of first pixel electrodes and the plurality of second pixel electrodes.

The OLED display can further include connection wirings that connect the plurality of first pixel electrodes to TFTs that correspond to the plurality of first pixel electrodes.

The connection wirings can include first connection wirings and second connection wirings, wherein the first connection wirings and the second connection wirings can be formed on different layers.

The plurality of first pixel electrodes include first pixel electrodes belonging to a first set and first pixel electrodes belonging to a second set, the first connection wirings can be connected to the first pixel electrodes belonging to the first set, and the second connection wirings can be connected to the first pixel electrodes belonging to the second set.

The substrate can include a first area that is located at one side of the bending area and a second area that is located at other side of the bending area, the plurality of TFTs can be formed in the first area and the second area, some first pixel electrodes from among the plurality of first pixel electrodes can be connected to TFTs that are formed in the first area, and remaining first pixel electrodes from among the plurality of first pixel electrodes are connected to TFTs that are formed in the second area.

The plurality of TFTs can be driving TFTs.

Another aspect is an organic light-emitting diode (OLED) display, comprising a substrate including a bending area and a non-bending area and a plurality of thin-film transistors (TFTs) formed in the non-bending area. The display also comprises a plurality of first pixel electrodes and a plurality of second pixel electrodes formed over the TFTs and electrically connected to the TFTs, wherein the first pixel electrodes are formed in the bending area and the second pixel electrodes are formed in the non-bending area.

In the above OLED display, the number of the TFTs is equal to the sum of the numbers of the first pixel electrodes and the second pixel electrodes.

The above OLED display further comprises a plurality of connection wirings configured to respectively connect the first pixel electrodes to the TFTs.

In the above OLED display, the connection wirings include a plurality of first connection wirings and a plurality of second connection wirings, wherein the first and second connection wirings are formed on different layers.

In the above OLED display, the first connection wirings are electrically connected to a first set of the first pixel electrodes, wherein the second connection wirings are electrically connected to a second set of the first pixel electrodes different from the first set.

In the above OLED display, the first set of first pixel electrodes is formed closer to the non-bending area than the second set of first pixel electrodes, wherein the second connection wirings are formed closer to the substrate than the first connection wirings.

In the above OLED display, the non-bending area comprises a first area located at one side of the bending area and a second area located at the other side of the bending area, wherein the TFTs are formed in the first area and the second area, wherein at least one of the first pixel electrodes is electrically connected to the TFTs formed in the first area, and wherein the remaining first pixel electrodes are electrically connected to the TFTs formed in the second area.

In the above OLED display, the TFTs include a plurality of driving TFTs.

Another aspect is an organic light-emitting diode (OLED) display comprising a substrate including a bending area and a non-bending area. The display also comprises a plurality of OLEDs comprising i) a first OLED and a second OLED both formed in the bending area, wherein each of the first and second OLEDs comprises a first pixel electrode, and ii) a third OLED formed in the non-bending area and comprising a second pixel electrode. The display further comprises a plurality of thin-film transistors (TFTs) comprising a first TFT and a second TFT both formed in the non-bending area. The display also comprises a plurality of connection wirings comprising i) a first wiring configured to electrically connect the first pixel electrode of the first OLED to the first TFT and ii) a second wiring configured to electrically connect the first pixel electrode of the second OLED to the second TFT, wherein the first and second wirings are formed on different layers.

In the above OLED display, the number of the TFTs is equal to the sum of the numbers of the first and second pixel electrodes.

In the above OLED display, the non-bending area comprises a first area located at one side of the bending area and a second area located at the other side of the bending area, wherein the TFTs are formed in the first area and the second area, wherein at least one of the first pixel electrodes is electrically connected to the TFTs formed in the first area, and wherein the remaining first pixel electrodes are electrically connected to the TFTs formed in the second area.

In the above OLED display, the first OLED is formed closer to the non-bending area than the second OLED, wherein the second wiring is formed closer to the substrate than the first wiring.

In the above OLED display, the non-bending area comprises a first non-bending area and a second non-bending area, wherein the bending area is interposed between the first and second non-bending areas.

DETAILED DESCRIPTION OF CERTAIN INVENTIVE EMBODIMENTS

Figure 1:
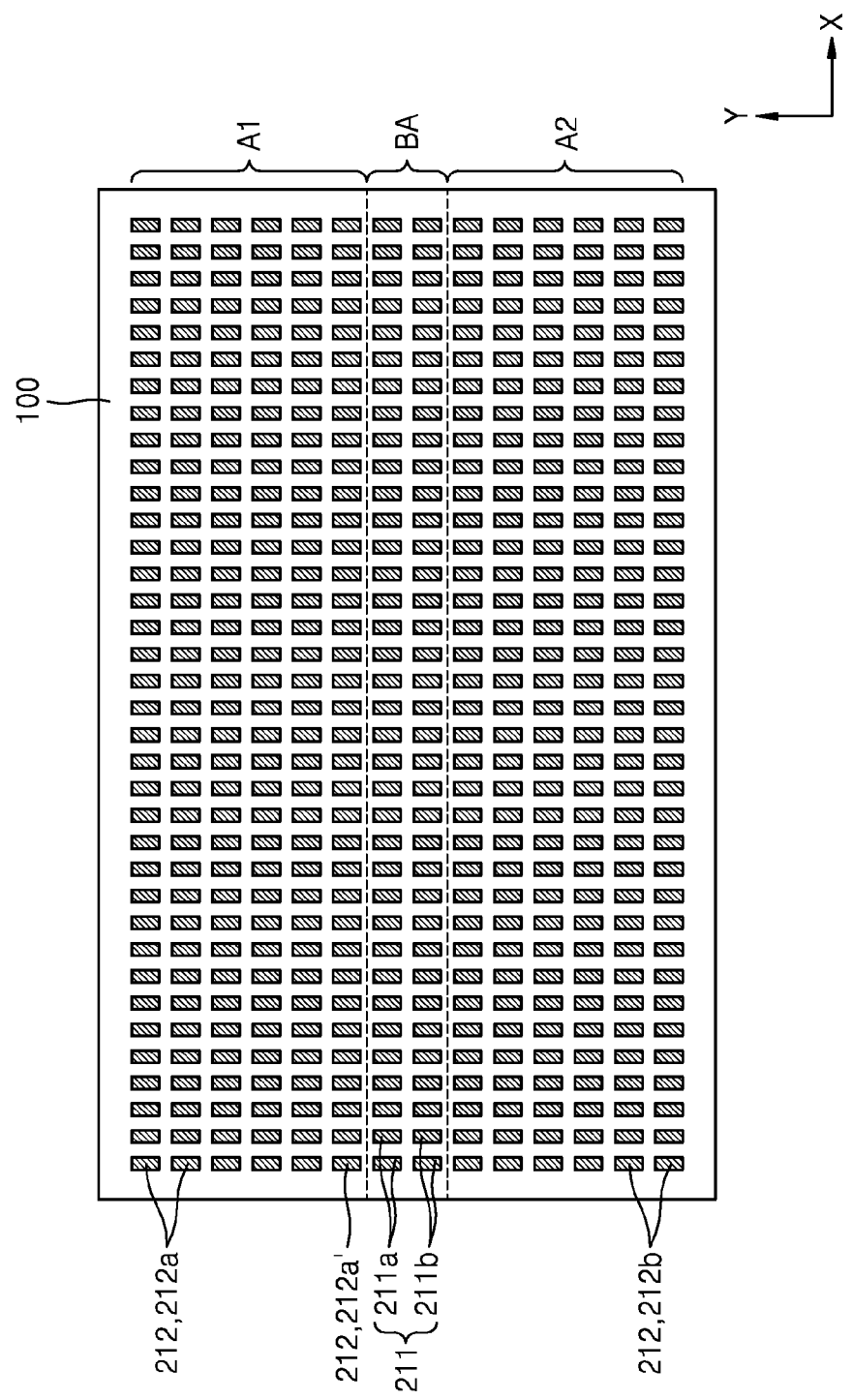
FIG. 1 is a plan view illustrating an arrangement of pixel electrodes of an OLED display, according to an exemplary embodiment.

A flexible OLED display includes a bending area where a portion of the display is bent. However, this portion is susceptible to display errors when bending the display after repetitive use.

The described technology can include various exemplary embodiments and modifications, and exemplary embodiments thereof will be illustrated in the drawings and will be described herein in detail. The advantages and features of the described technology and methods of achieving the advantages and features will be described more fully with reference to the accompanying drawings, in which exemplary embodiments are shown. The described technology can, however, be embodied in many different forms and should not be construed as being limited to the exemplary embodiments set forth herein.

Reference will now be made in detail to exemplary embodiments, examples of which are illustrated n the accompanying drawings. In the drawings, the same elements are denoted by the same reference numerals, and a repeated explanation thereof will not be given.

It will be understood that when a component, such as a layer, a film, a region, or a plate, is referred to as being "on" another component, the component can be directly on the other component or intervening components can be present thereon. Sizes of components in the drawings can be exaggerated for convenience of explanation. In other words, since sizes and thicknesses of components in the drawings are arbitrarily illustrated for convenience of explanation, the following exemplary embodiments are not limited thereto.

In the following exemplary embodiments, the x-axis, the y-axis and the z-axis are not limited to three axes of the rectangular coordinate system, and can be interpreted in a broader sense. For example, the x-axis, the y-axis, and the z-axis can be perpendicular to one another, or can represent different directions that are not perpendicular to one another.

As used herein, the term "and/or" includes any and all combinations of one or more of the associated listed items.

Expressions such as "at least one of," when preceding a list of elements, modify the entire list of elements and do not modify the individual elements of the list. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 2:
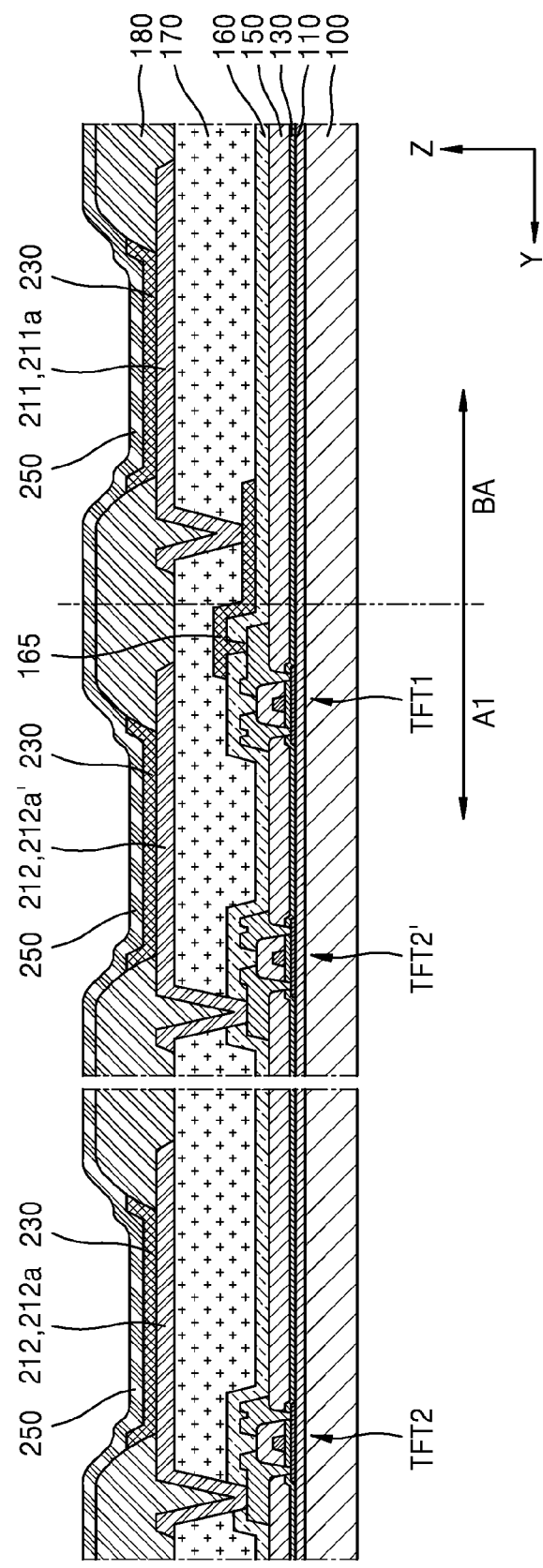
FIG. 2 is a cross-sectional view illustrating a part of the OLED display of FIG. 1, according to an exemplary embodiment.

FIG. 1 is a plan view illustrating an arrangement of a plurality of pixel electrodes of an OLED display, according to an exemplary embodiment. FIG. 2 is a cross-sectional view illustrating a part of the OLED display of FIG. 1, according to an exemplary embodiment.

The OLED display includes a substrate 100, a plurality of thin-film transistors (TFTs) TFT1, TFT2, and TFT2', and the pixel electrodes (e.g., first and second pixel electrodes 211 and 212).

The substrate 100 is flexible. The substrate 100 can be formed of a plastic material such as polyethylene terephthalate (PET), polyethylene naphthalate (PEN), or polyimide.

The substrate 100 includes a bending area BA as shown in FIG. 1. A first area or non-bending area A1 can be located at one side of the bending area BA and a second area or non-bending area A2 can be located at the other side of the bending area BA of the substrate 100. The bending area BA can be an area where the OLED display is mainly bent.

The transistors TFT1, TFT2, and TFT2' are formed in an area of the substrate 100 other than the bending area BA. The transistors TFT1, TFT2, and TFT2' can be driving TFTs for driving OLEDs as will be described below. That is, the transistors TFT1, TFT2, and TFT2' are not formed in the bending area BA of the substrate 100.

The OLED display further includes, for example, a buffer layer 110 that is formed to prevent impurities from penetrating into semiconductor layers of the transistors TFT1, TFT2, and TFT2' The OLED display can also include a gate insulating film 130 that insulates the semiconductor layers and gate electrodes of the transistors TFT1, TFT2, and TFT2', an interlayer insulating film 150 that insulates source/drain electrodes and the gate electrodes of the transistors TFT1, TFT2, and TFT2', and a planarization film 170 that covers the transistors TFT1, TFT2, and TFT2' and has a flat top surface.

The pixel electrodes can be semi-transparent electrodes or reflective electrodes. When the pixel electrodes are semi-transparent, they can be formed of, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrodes are reflective electrodes, the pixel electrodes can include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a compound thereof and a film formed of ITO, IZO, ZnO, or $In_2O_3$. Configurations and materials of the pixel electrodes are not limited thereto and various modifications can be made.

The pixel electrodes are formed in the bending area BA and the first and second areas A1 and A2 of the substrate 100. The pixel electrodes are formed over a layer on which the transistors TFT1, TFT2, and TFT2' are formed. The pixel electrodes can be divided into the first pixel electrodes 211 that are formed in the bending area BA and the second pixel electrodes 212 that are formed in the first and second areas A1 and A2 other than the bending area BA. The first pixel electrodes 211 and the second pixel electrodes 212 are electrically connected to the transistors TFT1, TFT2, and TFT2'.

A pixel defining film 180 can be formed to partially cover the first and second pixel electrodes 211 and 212. The pixel defining film 180 can function to define pixels by having openings through which central portions of the first and second pixel electrodes 211 and 212 or the entire first and second pixel electrodes 211 and 212 are exposed. Also, the pixel defining film 180 can function to prevent an arc or the like from occurring at end portions of the first and second pixel electrodes 211 and 212 by increasing a distance between the end portions of the first and second pixel electrodes 211 and 212 and a counter electrode 250 that is formed over the first and second pixel electrodes 211 and 212.

An intermediate layer 230 is formed on the first and second pixel electrodes 211 and 212. The intermediate layer 230 can have a multi-layer structure including an emission layer. In this case, unlike in FIG. 2, some layers of the intermediate layer 230 can be common layers corresponding to an entire surface of the substrate 100, and other layers of the intermediate layer 230 can be pattern layers that are patterned to correspond to the first and second pixel electrodes 211 and 212. The intermediate layer 230 can be formed of a low molecular or high molecular weight material, and can include a hole injection layer (HIL), a hole transport layer (HTL), the emission layer, an electron transport layer (ETL), and/or an electron injection layer (EIL). The intermediate layer 230 can be formed by using any of various methods such as deposition, spin coating, inkjet printing, and/or laser thermal transfer.

The counter electrode 250 is formed on the intermediate layer 230, and can be integrally formed with the first and second pixel electrodes 211 and 212 as shown in FIG. 2. The counter electrode 250 can be a semi-transparent or reflective electrode. When the counter electrode 250 is a semi-transparent electrode, the counter electrode 250 can have a multi-layer structure including a first deposition film formed of lithium (Li), calcium (Ca), lithium fluoride (LiF)/Ca, LiF/Al, Al, alabamine (Ab), ytterbium (Yb), or Mg and a second deposition film formed of a semi-transparent material such as ITO, IZO, ZnO, or $In_2O_3$. When the counter electrode 250 is a reflective electrode, the counter electrode 250 can include a layer including at least one selected from, for example, Li, Ca, LiF/Ca, LiF/Al, Al, Yb, Ag, and Mg.

The intermediate layer 230, the counter electrode 250, and one of the first and second pixel electrodes 211 and 212 can function as an OLED. That is, in FIG. 2, a plurality of the OLEDs is formed on the substrate 100 and in this case, the counter electrodes 250 of the OLEDs are integrally formed.

In the OLED display according to the present exemplary embodiment, the first and second pixel electrodes 211 and 212 are formed over the entire substrate 100. However, the transistors TFT1, TFT2, and TFT2' that are electrically connected to the first and second pixel electrodes 211 and 212 are not formed in the bending area BA and are formed in the first area A1 or the second area A2 of the substrate 100. Accordingly, when the substrate 100 is bent, the transistors TFT1, TFT2, and TFT2' are not bent.

If some of the transistors TFT1, TFT2, and TFT2' that are electrically connected to the first and second pixel electrodes 211 and 212 are formed in the bending area BA, electrical characteristics of the some of the transistors TFT1, TFT2, and TFT2' are changed when the substrate 100 is bent. For example, when the substrate 100 is repeatedly bent in a state where TFTs are formed in the bending area BA, the amount of leakage current or off-current flowing when the some TFTs are turned off is increased. In this case, when the OLED display operates to emit light having a high brightness, pixels that are connected to the TFTs formed in the bending area BA can emit light having a relatively low brightness. In contrast, when the OLED display operates to emit light having a low brightness, pixels that are connected to the some TFTs formed in the bending area BA can emit light having a relatively high brightness. That is, bright lines can be formed in the bending area BA.

However, in the OLED display according to the present exemplary embodiment, the transistors TFT1, TFT2, and TFT2' that are electrically connected to the first and second pixel electrodes 211 and 212 are not formed in the bending area BA and are formed in the first area A1 or the second area A2. Accordingly, when the substrate 100 is bent, the effect of the bending on the transistors TFT1, TFT2, and TFT2' can be prevented or minimized. Accordingly, even when the substrate 100 is bent, a display error such as dark lines or bright lines which are formed in the bending area BA can be prevented or minimized.

A brightness or the like of the OLEDs is controlled by driving TFTs. Accordingly, the transistors TFT1, TFT2, and TFT2' that are not formed in the bending area BA and are formed only in the first and second areas A1 and A2 other than the bending area BA can be the driving TFTs. That is, if the transistors TFT1, TFT2, and TFT2' are switching TFTs instead of driving TFTs, the transistors TFT1, TFT2, and TFT2' can be formed in the bending area BA if necessary. In this case, since the transistors TFT1, TFT2, and TFT2' that are not formed in the bending area BA and are formed only in the first and second areas A1 and A2 are driving TFTs, the number of the transistors TFT1, TFT2, and TFT2' can be equal to the total number of the first pixel electrodes 211 and the second pixel electrodes 212, i.e., the number obtained by summing the numbers of the first and second pixel electrodes 211 and 212.

TFTs, capacitors, etc. other than driving TFTs can also not be formed in the bending area BA and can be formed in the first and second areas A1 and A2.

The first pixel electrodes 211 that are formed in the bending area BA from among the first and second pixel electrodes 211 and 212 are electrically connected to the transistors TFT1 that are formed in an area of the substrate 100 other than the bending area BA. In FIG. 1, the first pixel electrodes 211 are electrically connected to the transistors TFT1 that are formed in the first area A1. To this end, as shown in FIG. 1, the OLED display according to the present exemplary embodiment further includes connection wirings 165 that connect the first pixel electrodes 211 to the transistors TFT1 that correspond to the first pixel electrodes 211 from among the transistors TFT1, TFT2, and TFT2'. The connection wirings 165 can be formed on an insulating layer 160 that covers the transistors TFT1, TFT2, and TFT2'. The connection wirings 165 extend (along a y-axis of FIG. 2) over the bending area BA and the first area A1 of the substrate 100.

Figure 3:
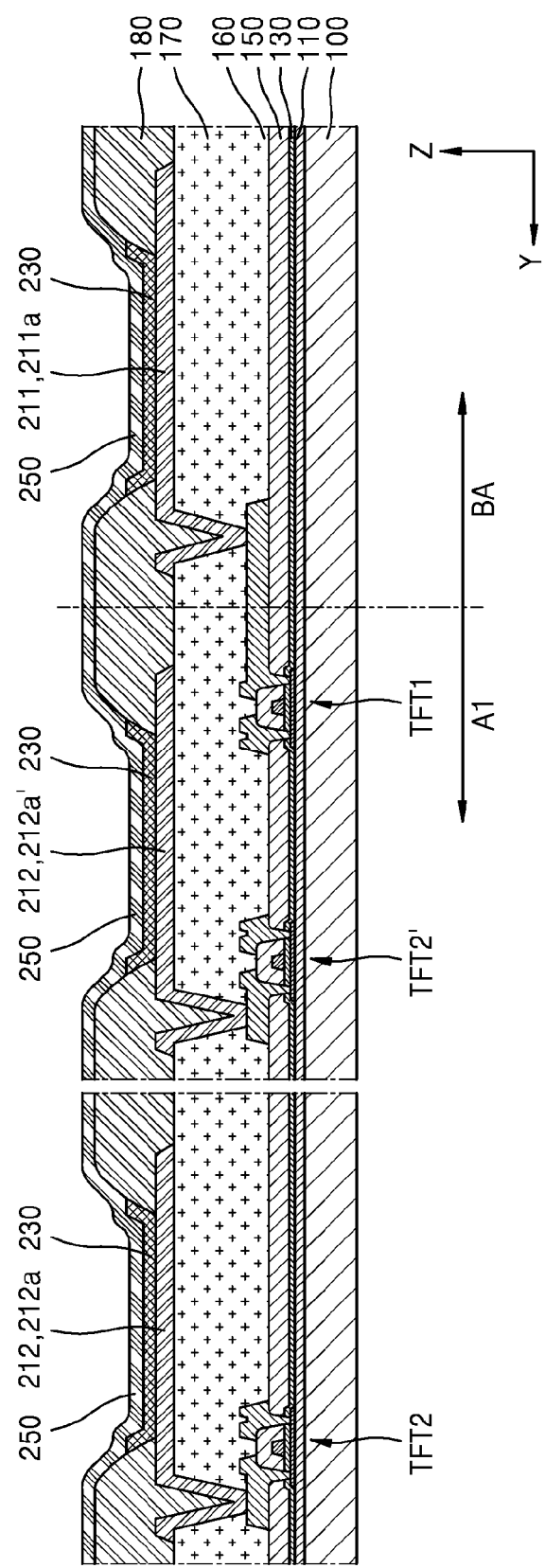
FIG. 3 is a cross-sectional view illustrating a part of the OLED display of FIG. 1, according to another exemplary embodiment.

FIG. 3 is a cross-sectional view illustrating a part of the OLED display of FIG. 1, according to another exemplary embodiment. As shown in FIG. 3, source electrodes or drain electrodes of the transistors TFT1 that are to be connected to the first pixel electrodes 211 can extend (along a y-axis of FIG. 3) over the bending area BA and the first area A1. Accordingly, the first pixel electrodes 211 that are formed in the bending area BA can be electrically connected to the transistors TFT1 that are formed in an area of the substrate 100 other than the bending area BA without the connection wirings 165.

Although the first pixel electrodes 211 that are formed in the bending area BA are connected to the transistors TFT1 that are formed in the first area A1 in FIG. 2, some of the first pixel electrodes 211 that are formed in the bending area BA can be connected to a plurality of TFTs that are formed in the second area A2. For example, referring to FIG. 1, from among the first pixel electrodes 211 that are formed in the bending area BA, first pixel electrodes 211a are electrically connected to TFTs that are formed in the first area A1, and the first pixel electrodes 211b are electrically connected to TFTs that are formed in the second area A2.

Although the transistors TFT2' that are connected to a plurality of second pixel electrodes 212a and are the closest to the bending area BA are formed right under the second pixel electrodes 212a in FIG. 2, the present exemplary embodiment is not limited thereto. That is, since the transistors TFT1 that are to be electrically connected to the first pixel electrodes 211a formed in the bending area BA are formed in a portion of the first area A1, which is the closest to the bending area BA, in some embodiments, the transistors TFT2' that are connected to the second pixel electrodes 212a' are not formed right under the second pixel electrodes 212a' and are formed at a position that is shifted to the left from the second pixel electrodes 212a'. The transistors TFT2 that are electrically connected to the second pixel electrodes 212a that are formed in a portion of the first area A1, which is the farthest from the bending area BA, can be formed right under the second pixel electrodes 212a. Even TFTs that are electrically connected to a plurality of second pixel electrodes 212b that are formed in a portion of the second area A2, which is the farthest from the bending area BA, can be formed right under the second pixel electrodes 212b.

Figure 4:
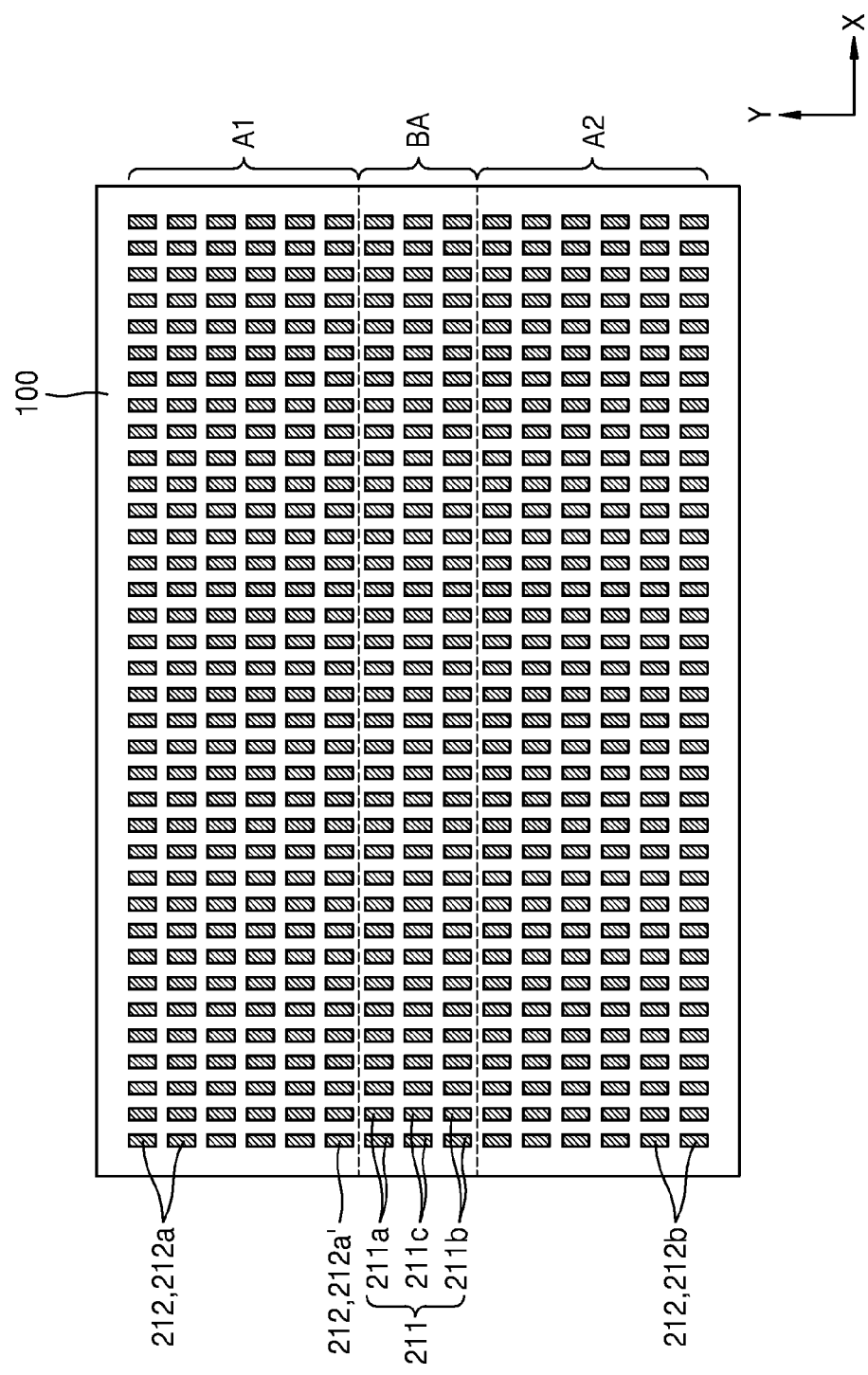
FIG. 4 is a plan view illustrating an arrangement of pixel electrodes of an OLED display, according to another exemplary embodiment.
Figure 5:
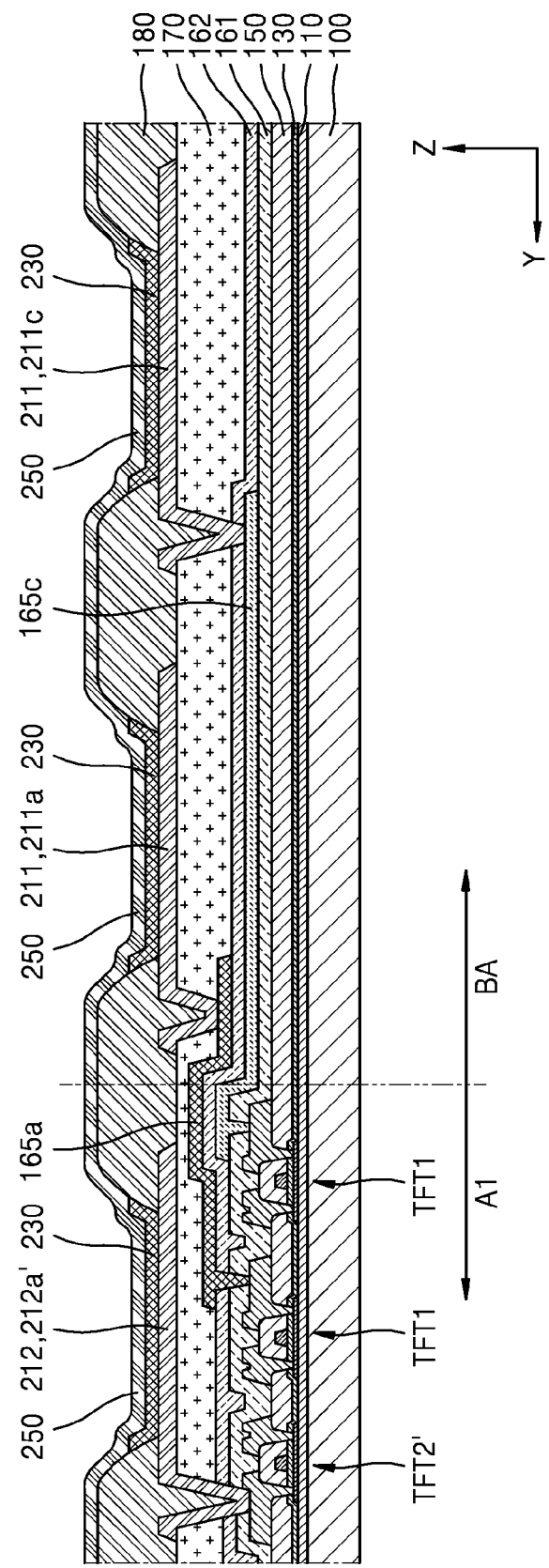
FIG. 5 is a cross-sectional view illustrating a part of the OLED display of FIG. 4, according to an exemplary embodiment.

FIG. 4 is a plan view illustrating an arrangement of the first and second pixel electrodes 211 and 212 of an OLED display, according to another exemplary embodiment. FIG. 5 is a cross-sectional view illustrating a part of the OLED display of FIG. 4, according to an exemplary embodiment. Referring to FIG. 4, the first pixel electrodes 211 are formed as a plurality of rows in the bending area BA. In this case, the first pixel electrodes 211a of a first row and first pixel electrodes 211c of a second row can be electrically connected to TFTs that are formed in the first area A1 and the first pixel electrodes 211b of a third row can be electrically connected to TFTs that are formed in the second area A2.

In this case, since both the first pixel electrodes 211a and the first pixel electrodes 211c are electrically connected to the TFTs that are formed in the first area A1, the connection wirings can include first connection wirings 165a and second connection wirings 165c that are formed on different layers. In detail, the first connection wirings 165a can be connected to the first pixel electrodes 211a belonging to a first set from among the first pixel electrodes 211, and the second connection wirings 165c can be connected to the first pixel electrodes 211c belonging to a second set from among the first pixel electrodes 211. The first pixel electrodes 211a of the first set from among the first pixel electrodes 211 can be the first pixel electrodes 211a of the first row that are formed in the bending area BA to be the closest to the first area A1, and the first pixel electrodes 211c of the second set from among the first pixel electrodes 211 can be the first pixel electrodes 211c of the second row.

Since the first and second connection wirings 165a and 165c that are formed on different layers are used, even when the first pixel electrodes 211 of a plurality of rows are formed in the bending area BA, the first pixel electrodes 211 can be efficiently electrically connected to the transistors TFT1 that are formed in the first area A1 or the second area A2. When the first and second connection wirings 165a and 165c that are formed on different layers are used, as shown in FIG. 5, the second connection wirings 165c can be formed on a first insulating layer 161 that covers the transistors TFT1 and TFT2' and the first connection wirings 165c can be formed on a second insulating layer 162 that covers the first connection wirings 165a.

Each of the transistors TFT1 can be formed so that one of the source electrode and the drain electrode that is connected to the first pixel electrode 211 is closer to the bending area BA than the other. This is in order to minimize lengths of the first and second connection wirings 165a and 165c that connect the transistors TFT1 to the first pixel electrodes 211. Each of the transistors TFT2' that are connected to the second pixel electrodes 212 formed in the first area A1 from among the transistors TFT1 and TFT2' that are formed in the first area A1 can be formed so that one of the source electrode and the drain electrode that is connected to the second pixel electrode 212 is farther away from the bending area BA than the other.

At least one of the disclosed embodiments provides an OLED display that prevents a display error from occurring in a bending area.

The foregoing is illustrative of exemplary embodiments, and is not to be construed as limiting thereof. Although a few exemplary embodiments have been described, those skilled in the art will readily appreciate that many modifications are possible in these embodiments without materially departing from their novel teachings and advantages. Accordingly, all such modifications are intended to be included within the scope of the appended claims.

What is claimed is:

1. An organic light-emitting diode (OLED) display, comprising:
    a substrate including a bending area and a non-bending area;
    a plurality of thin-film transistors (TFTs) in the non-bending area; and
    a plurality of first pixel electrodes in the bending area and a plurality of second pixel electrodes in the non-bending area, wherein the first pixel electrodes and the second pixel electrodes are electrically connected to the plurality of TFTs in the non-bending area.

2. The OLED display of claim 1, wherein the number of the TFTs is equal to the sum of the numbers of the first pixel electrodes and the second pixel electrodes.

3. The OLED display of claim 2, further comprising a plurality of connection wirings configured to respectively connect the first pixel electrodes to the TFTs.

4. The OLED display of claim 3, wherein the connection wirings include a plurality of first connection wirings and a plurality of second connection wirings, and wherein the first and second connection wirings are formed on different layers.

5. The OLED display of claim 4, wherein the first connection wirings are electrically connected to a first set of the first pixel electrodes, and wherein the second connection wirings are electrically connected to a second set of the first pixel electrodes different from the first set.

6. The OLED display of claim 5, wherein the first set of first pixel electrodes is closer to the non-bending area than the second set of first pixel electrodes, and wherein the second connection wirings are closer to the substrate than the first connection wirings.

7. The OLED display of claim 1, wherein the non-bending area comprises a first area located at one side of the bending area and a second area located at the other side of the bending area, wherein the TFTs are in the first area and the second area, wherein at least one of the first pixel electrodes is electrically connected to the TFTs in the first area, and wherein the remaining first pixel electrodes are electrically connected to the TFTs in the second area.

8. The OLED display of claim 1, wherein the TFTs include a plurality of driving TFTs.

9. An organic light-emitting diode (OLED) display, comprising:
- a substrate including a bending area and a non-bending area;
- a plurality of OLEDs comprising i) a first OLED and a second OLED in the bending area, wherein each of the first and second OLEDs comprises a first pixel electrode, and ii) a third OLED in the non-bending area and comprising a second pixel electrode;
- a plurality of thin-film transistors (TFTs) comprising a first TFT and a second TFT in the non-bending area; and
- a plurality of connection wirings comprising i) a first wiring configured to electrically connect the first pixel electrode of the first OLED to the first TFT and ii) a second wiring configured to electrically connect the first pixel electrode of the second OLED to the second TFT, wherein the first and second wirings are on different layers.

10. The OLED display of claim 9, wherein the number of the TFTs is equal to the sum of the numbers of the first and second pixel electrodes.

11. The OLED display of claim 9, wherein the non-bending area comprises a first area located at one side of the bending area and a second area located at the other side of the bending area, wherein the TFTs are in the first area and the second area, wherein at least one of the first pixel electrodes is electrically connected to the TFTs in the first area, and wherein the remaining first pixel electrodes are electrically connected to the TFTs in the second area.

12. The OLED display of claim 9, wherein the first OLED is closer to the non-bending area than the second OLED, and wherein the second wiring is closer to the substrate than the first wiring.

13. The OLED display of claim 9, wherein the non-bending area comprises a first non-bending area and a second non-bending area, and wherein the bending area is interposed between the first and second non-bending areas.

14. The OLED display of claim 1, wherein the substrate further includes an additional non-bending area, and wherein the bending area is interposed between the non-bending area and the additional non-bending area.

* * * * *